United States Patent
Aihara

(10) Patent No.: US 8,178,821 B2
(45) Date of Patent: May 15, 2012

(54) SUBSTRATE TREATING APPARATUS

(75) Inventor: Tomoaki Aihara, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 873 days.

(21) Appl. No.: 11/560,121

(22) Filed: Nov. 15, 2006

(65) Prior Publication Data

US 2007/0113744 A1 May 24, 2007

(30) Foreign Application Priority Data

Nov. 21, 2005 (JP) ................................. 2005-335836

(51) Int. Cl.
*H05B 1/02* (2006.01)

(52) U.S. Cl. ........ 219/490; 219/508; 219/509; 219/702; 134/32; 134/56 R

(58) Field of Classification Search .................. 219/490, 219/509, 608, 702; 134/32, 56 R; 99/519; 34/341, 526
See application file for complete search history.

(56) References Cited

U.S. PATENT DOCUMENTS

| | | | | |
|---|---|---|---|---|
| 5,520,744 | A * | 5/1996 | Fujikawa et al. | 134/11 |
| 5,937,223 | A * | 8/1999 | Akimoto et al. | 396/604 |
| 6,027,760 | A * | 2/2000 | Gurer et al. | 427/8 |
| 6,108,928 | A | 8/2000 | Park et al. | |
| 6,299,696 | B2 | 10/2001 | Kamikawa et al. | |
| 6,342,104 | B1 * | 1/2002 | Kamikawa et al. | 134/26 |
| 6,558,477 | B1 * | 5/2003 | Scovell | 134/30 |
| 6,729,040 | B2 * | 5/2004 | Mehmandoust | 34/443 |
| 2001/0007259 | A1 | 7/2001 | Nakashima et al. | |
| 2002/0174882 | A1* | 11/2002 | Kimura | 134/21 |
| 2005/0183755 | A1* | 8/2005 | Fujishima | 134/56 R |

FOREIGN PATENT DOCUMENTS

| | | |
|---|---|---|
| JP | 7-204592 | 8/1995 |
| JP | 8-264265 | 10/1996 |
| JP | 8-334235 | 12/1996 |
| JP | 11-97409 | 4/1999 |
| JP | 11-121429 | 4/1999 |
| JP | 2001-176833 | 6/2001 |
| JP | 2002-317069 | 10/2002 |
| JP | 2003-75067 | 3/2003 |
| JP | 2004-63513 | 2/2004 |
| JP | 2005-177652 | 7/2005 |

OTHER PUBLICATIONS

Japanese Office Action issued Dec. 22, 2009 in connection with corresponding Japanese Application No. JP2005-335836.
Japanese Office Action issued Jul. 13, 2010 in connection with corresponding Japanese Application No. JP2005-335836.

* cited by examiner

*Primary Examiner* — Henry Yuen
*Assistant Examiner* — Brian Jennison
(74) *Attorney, Agent, or Firm* — Ostrolenk Faber LLP

(57) ABSTRACT

A substrate treating apparatus for treating substrates with a treating liquid is disclosed. The apparatus includes a treating tank for storing the treating liquid, and treating the substrates as immersed in the treating liquid, a chamber surrounding the treating tank, a supply device for supplying an inert gas containing an organic solvent into the chamber, a lift mechanism vertically movable, while supporting the substrates, between a process position in the treating tank and a wait position above the treating tank and inside the chamber, a tank temperature control device for controlling temperature of the treating tank, a chamber temperature control device for controlling temperature of the chamber, and a control device for causing the tank temperature control device and the chamber temperature control device to perform heating treatment at least while the inert gas containing the organic solvent is supplied from the supply device.

12 Claims, 4 Drawing Sheets

SUBSTRATE TREATING APPARATUS

BACKGROUND OF THE INVENTION (1) Field of the Invention

This invention relates a substrate treating apparatus for treating substrates such as semiconductor wafers or glass substrates for liquid crystal displays (hereinafter called simply substrates) with treating liquids such as deionized water and chemicals. More particularly, the invention relates to a technique for performing drying treatment of substrates by supplying an inert gas such as nitrogen gas containing an organic solvent such as isopropyl alcohol.

(2) Description of the Related Art

A conventional substrate treating apparatus of this type includes a treating tank for storing treating liquids and receiving substrates for treatment, a chamber surrounding the treating tank, a lift mechanism for supporting the substrates and vertically movable between a process position inside the treating tank and a wait position above the treating tank and inside the chamber, and nozzles disposed in upper positions inside the chamber for supplying nitrogen gas containing isopropyl alcohol into the chamber (see Japanese Unexamined Patent Publication No. 2004-63513 (FIG. 1), for example).

The conventional apparatus with the above construction has the following drawbacks.

In the conventional apparatus, when the treating tank stores deionized water, the treating tank itself is at a low temperature, resulting in a drawback of the isopropyl alcohol contained in the inert gas condensing on the treating tank. Such condensation lowers the density of the isopropyl alcohol supplied into the chamber, so that the isopropyl alcohol cannot fully replace the deionized water adhering to the substrates, and thus a possibility of insufficient drying performance.

When not only the treating tank but the chamber itself lowers in temperature, the isopropyl alcohol may condense in the chamber, causing the same problem as above.

SUMMARY OF THE INVENTION

This invention has been made having regard to the state of the art noted above, and its object is provide a substrate treating apparatus that can prevent condensation of an organic solvent such as isopropyl alcohol, thereby avoiding insufficient drying performance.

The above object is fulfilled, according to this invention, by a substrate treating apparatus for treating substrates with a treating liquid, comprising a treating tank for storing the treating liquid, and treating the substrates as immersed in the treating liquid; a chamber surrounding the treating tank; a supply device for supplying an inert gas containing an organic solvent into the chamber; a lift mechanism vertically movable, while supporting the substrates, between a process position in the treating tank and a wait position above the treating tank and inside the chamber; a tank temperature control device for controlling temperature of the treating tank; a chamber temperature control device for controlling temperature of the chamber; and a control device for causing the tank temperature control device and the chamber temperature control device to perform heating treatment at least while the inert gas containing the organic solvent is supplied from the supply device.

According to this invention, the control device causes the tank temperature control device and the chamber temperature control device to perform heating treatment at least while the inert gas containing the organic solvent is supplied from the supply device. It is thus possible to prevent the organic solvent supplied into the chamber from condensing in the chamber and treating tank. As a result, the concentration of the isopropyl alcohol in the chamber does not decrease, thereby avoiding insufficient drying performance.

In this invention, the tank temperature control device may include a tank temperature control jacket attached to outer surfaces of the treating tank.

Then, the tank temperature control device may is readily usable in an existing apparatus.

The tank temperature control device and the chamber temperature control device may be constructed to have heating and cooling capabilities, the control device causing the tank temperature control device to carry out a cooling performance when lowering temperature of the treating liquid stored in the treating tank.

Once the treating liquid stored in the treating tank is heated for treatment of the substrates, it will take a very long time to cool the liquid by relying on natural heat dissipation. The cooling of the treating liquid may be assisted by cooling the treating tank with the tank temperature control device and chamber temperature control device, thereby lowering the temperature of the treating liquid quickly.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An embodiment of this invention will be described in detail hereinafter with reference to the drawings.

Figure 1:
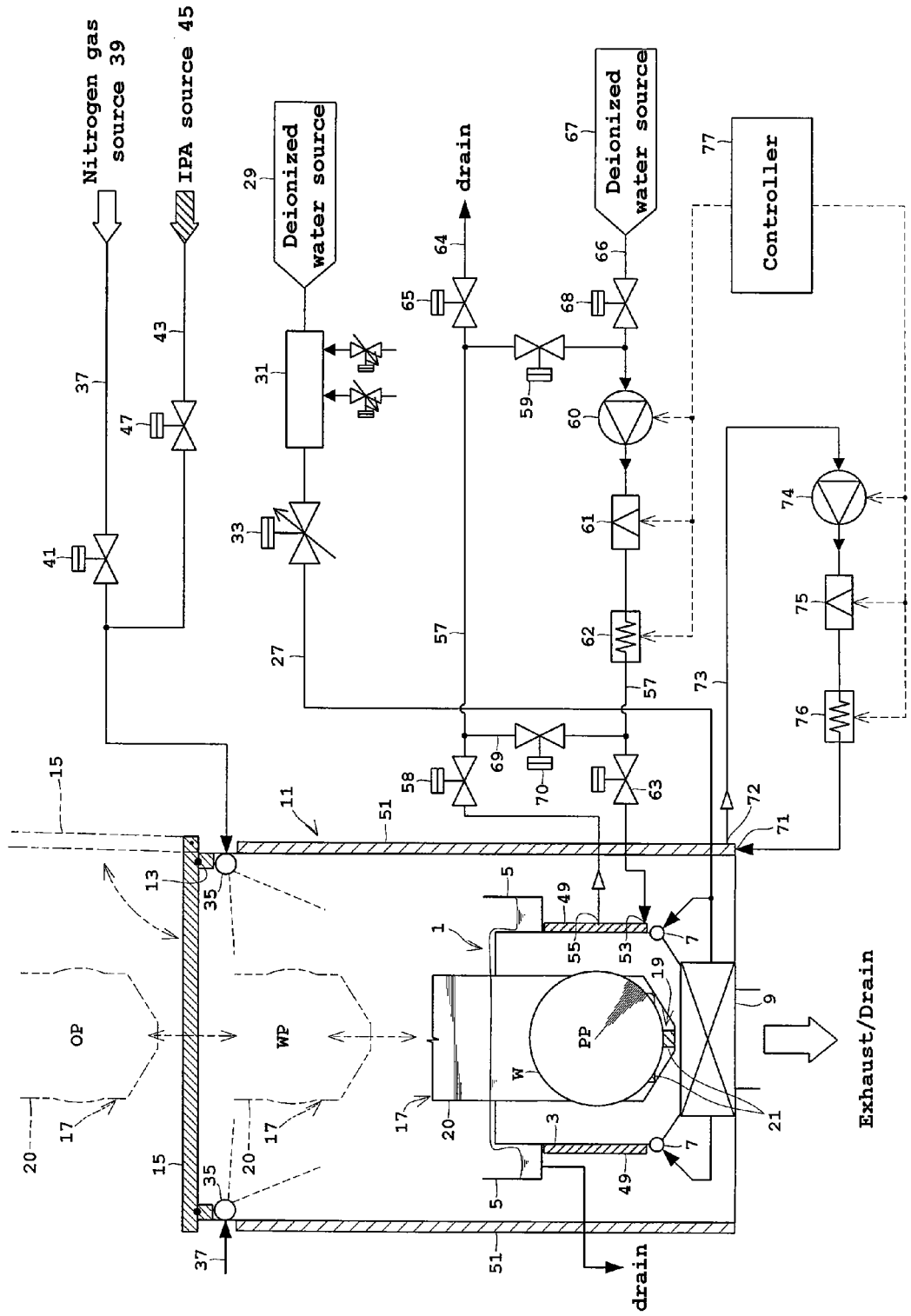
FIG. 1 is a block diagram showing an outline of a substrate treating apparatus according to the invention.

FIG. 1 is a block diagram showing an outline of a substrate treating apparatus according to the invention.

A treating tank 1 stores a treating liquid, and receives wafers W to be immersed in the treating liquid for cleaning treatment. The treating tank 1 includes an inner tank 3 and an outer tank 5. The inner tank 3 has jet pipes 7 disposed at opposite sides in the bottom thereof for supplying the treating liquid into the inner tank 3, and an outlet 9 formed centrally of the bottom for discharging the treating liquid from the inner tank 3. The outer tank 5 collects and discharges the treating liquid overflowing the inner tank 3. The entire treating tank 1 is enclosed in a chamber 11. The chamber 11 has a top opening 13 openable and closable by a shutter 15. The chamber 11 has a space and height enough to form a wait position WP above the treating tank 1 for temporarily accommodating the wafers W for drying treatment.

A lift mechanism 17 has a holder 19 vertically movable between a process position PP inside the inner tank 3, the above-mentioned wait position WP, and an outer position OP above the chamber 11. The holder 19 includes a back board 20 extending vertically, and contact members 21 extending horizontally from lower positions of the back board 20. The contact members 21 support lower parts of a plurality of wafers W to hold the wafers W in vertical posture.

The jet pipes 7 mentioned above are connected to one end of a supply pipe 27 having the other end connected to a deionized water source 29. The supply pipe 27 has a mixing valve 31 and a control valve 33 arranged from upstream to downstream thereon. The mixing valve 31 introduces two or more types of chemicals into the supply pipe 27. The control valve 33 controls the flow rate of the treating solution through the supply pipe 27, and permits and stops its flow.

Nozzles 35 are arranged in upper positions of the chamber 11 for supplying nitrogen gas, or nitrogen gas containing isopropyl alcohol, into the chamber 11. The nozzles 35 are in communication with one end of a supply pipe 37 having the other end connected to a nitrogen gas source 39. Supply of nitrogen gas is controlled by a switch valve 41. One end of a branch pipe 43 is connected to a position of the supply pipe 37 downstream of the switch valve 41. The other r end of the branch pipe 43 is connected to an isopropyl alcohol source 45. Supply of isopropyl alcohol is controlled by a switch valve 47 mounted on the branch pipe 43.

The treating tank 1 noted above has a tank temperature control jacket 49 attached to outer peripheral surfaces of the inner tank 3 not for temperature control of the treating liquid stored in the treating tank 1, but for temperature control of the treating tank 1, especially of the inner tank 3 itself. The chamber 11 has a chamber temperature control jacket 51 attached to outer peripheral surfaces of the chamber 11 not for temperature control of the entire space inside the chamber 11, but for temperature control of inner wall surfaces of the chamber 11.

The tank temperature control jacket 49 has, formed therein, an inlet 53 for entry of temperature control water, and an outlet 55 for exit of the temperature control water. A first circulation piping 57 is connected to the inlet 53 and outlet 55 for circulating the temperature control water flowing out of the outlet 55 to the inlet 53. The first circulation piping 57 has a switch valve 58, a switch valve 59, a pump 60, a cooler 61, a heater 62 and a switch valve 63 arranged in order from upstream to downstream thereon.

A drain pipe 64 is connected to the first circulation piping 57 between the switch valve 58 and switch valve 59 for draining the temperature control water from the first circulation piping 57. The drain pipe 64 has a switch valve 65 for controlling drainage of the temperature control water. One end of a supply pipe 66 is connected to the first circulation piping 57 between the switch valve 59 and pump 60 for supplying deionized water as the temperature control water to the first circulation piping 57. The other end of the supply pipe 66 is connected to a deionized water source 67. The supply pipe 66 has a switch valve 68 for controlling supply of the temperature control water. A pipe 69 extends for communication from a position of the first circulation piping 57 between the switch valve 58 and switch valve 59 to a position of the piping 57 between the heater 62 and switch valve 63. The pipe 69 has a switch valve 70 mounted thereon.

When the tank temperature control jacket 49 heats the peripheries of the treating tank 1, the switch valve 68 is opened first to supply the temperature control water from the deionized water source 67 through the supply pipe 66 to the first circulation piping 57. At the same time, the switch valve 58, switch valve 65 and switch valve 63 are closed, and the switch valve 59 and switch valve 70 are opened. Then, the pump 60 circulates the temperature control water through the first circulation piping 57 and pipe 69. At this time, the temperature control water in circulation is heated by the heater 62. Next, the switch valve 58 and switch valve 63 are opened, and the switch valve 65, switch valve 68 and switch valve 70 are closed. The pump 60 supplies the heated temperature control water into the tank temperature control jacket 49 through the inlet 53. As a result, the tank temperature control jacket 49 heats the peripheries of the treating tank 1. At this time, the pump 60 circulates the temperature control water through the first circulation piping 57 and tank temperature control jacket 49.

When the tank temperature control jacket 49 cools the peripheries of the treating tank 1, the heater 62 is turned off, and the cooler 61 is turned on to cool the temperature control water being circulated by the pump 60 through the first circulation piping 57 and tank temperature control jacket 49. As a result, the pump 60 supplies the cooled temperature control water into the tank temperature control jacket 49 through the inlet 53. Thus, the tank temperature control jacket 49 cools the peripheries of the treating tank 1.

When the tank temperature control jacket 49 cools the peripheries of the treating tank 1, the switch valve 65 may be opened to drain, through the drain pipe 64, the temperature control water circulated by the pump 60 through the first circulation piping 57 and tank temperature control jacket 49. And new temperature control water may be supplied from the deionized water source 67 through the supply pipe 66 to the first circulation piping 57. This temperature control water may be supplied directly into the tank temperature control jacket 49 through the inlet 53.

The chamber temperature control jacket 51 has, formed therein, an inlet 71 for entry of temperature control water, and an outlet 72 for exit of the temperature control water. A second circulation piping 73 is connected to the inlet 71 and outlet 72 for circulating the temperature control water flowing out of the outlet 72 to the inlet 71. The second circulation piping 73 has a pump 74, a cooler 75 and a heater 76 arranged in order from upstream to downstream thereon.

When the chamber temperature control jacket 51 heats the inner wall surfaces of the chamber 11, the heater 76 is turned on, and the pump 74 is operated to circulate the temperature control water through the second circulation piping 73 and chamber temperature control jacket 51. When the chamber temperature control jacket 51 cools the inner wall surfaces of the chamber 11, the cooler 75 is turned on, and the pump 74 is operated to circulate the temperature control water through the second circulation piping 73 and chamber temperature control jacket 51.

The tank temperature control jacket 49, inlet 53, outlet 55, first circulation piping 57, pump 60, cooler 61 and heater 62 constitute the "tank temperature control device" in this invention. The temperature control jacket 51, inlet unit 71, outlet 72, second circulation piping 73, pump 74, cooler 75 and heater 76 constitute the "chamber temperature control device" in this invention.

The above temperature control water may be deionized water, for example. Where deionized water is used for temperature control, the temperature does not exceed 100° C. even when the apparatus runs out of control. Thus, the apparatus has an explosion-proof construction that can prevent explosion and fire.

The vertical movement of the lift mechanism 17 noted hereinbefore, opening and closing of the shutter 15, operation of the control valve 33 and the like, opening and closing of the outlet 9, operation of the pumps 60 and 74, temperature control of the coolers 61 and 75 and temperature control of the heaters 62 and 76 are controlled in a concerted way by a controller 77 (control device). The controller 77 controls these components according to a recipe.

Figure 2:
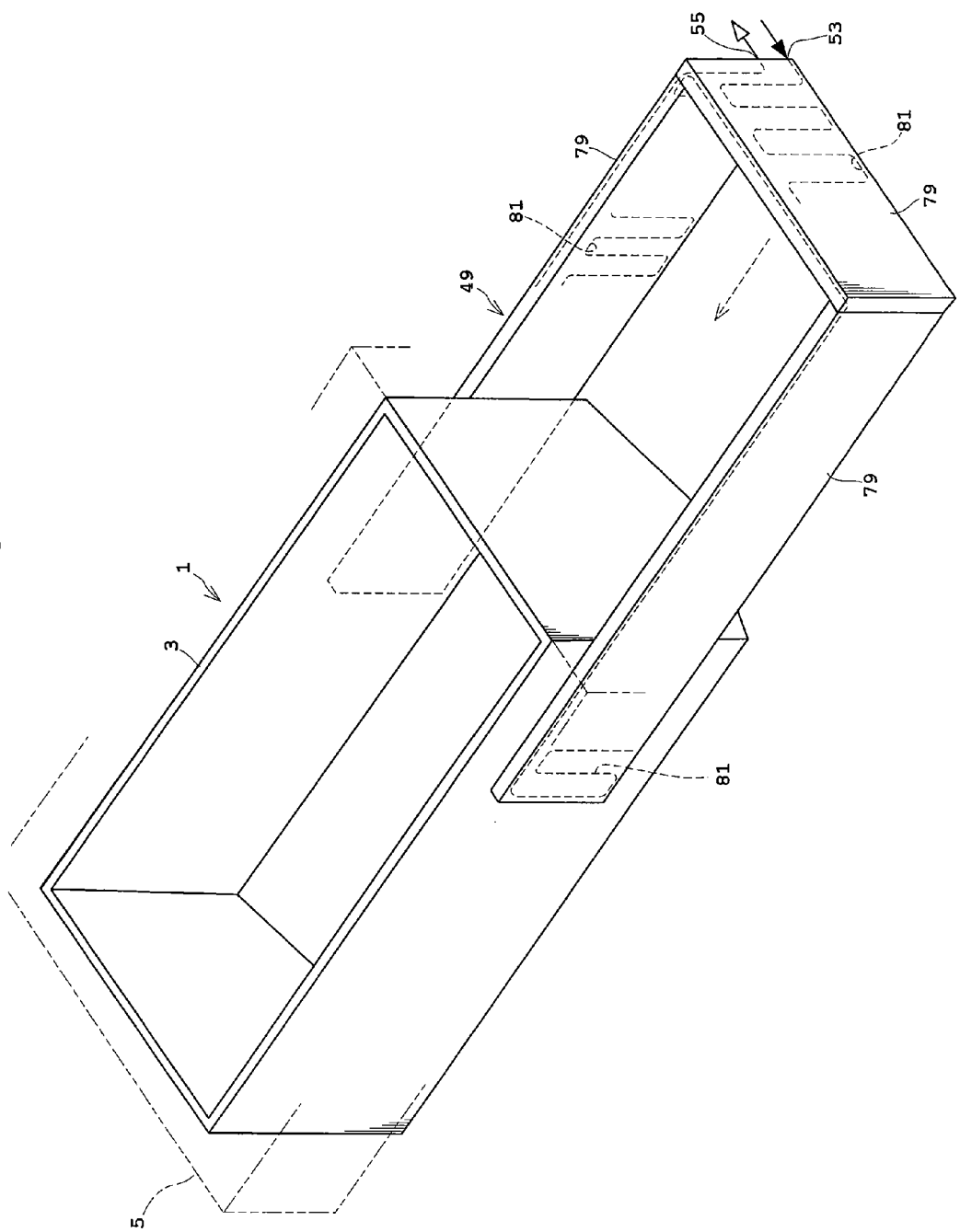
FIG. 2 is a perspective view showing an outline of a tank temperature control jacket.

Next, the tank temperature control jacket 49 will be described with reference to FIG. 2. FIG. 2 is a perspective view showing an outline of the tank temperature control jacket 49.

The tank temperature control jacket 49 has three temperature control attachments 79 shaped to follow the shapes of opposite side surfaces and a front surface of the inner tank 3. The tank temperature control jacket 49 is substantially U-shaped in plan view, and is attached to contact the side surfaces and front surface of the inner tank 3. Each temperature control attachment 79, preferably, is formed of a material with high thermal conductivity. Each temperature control attachment 79 defines a circulation path 81 therein for circulating the temperature control water. The circulation paths 81 are formed in a zigzag shape to conduct heat to the inner tank 3 efficiently, and extend from one inlet 53 to one outlet 55. A plurality of inlets 53 and a plurality of outlets 55 may be provided instead.

Figure 3:
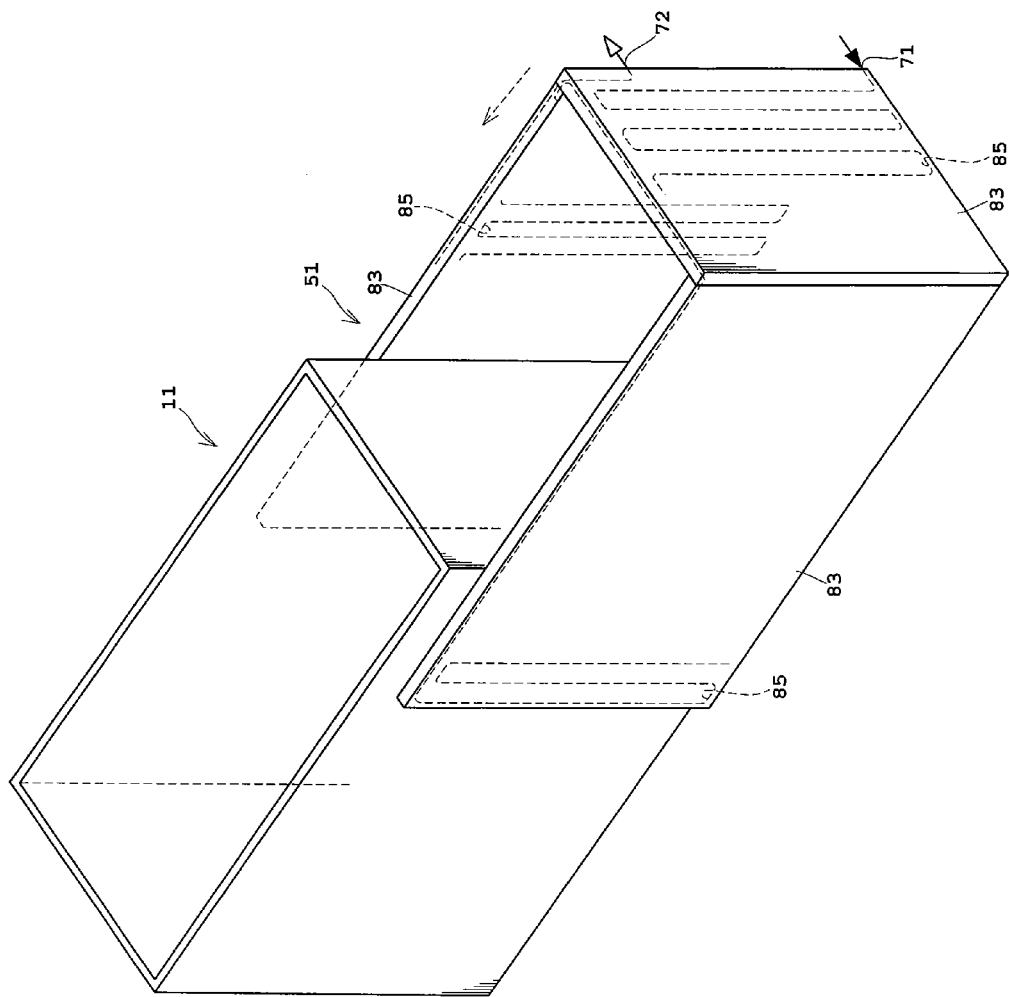
FIG. 3 is a perspective view showing an outline of a chamber temperature control jacket.

Next, the chamber temperature control jacket 51 will be described with reference to FIG. 3. FIG. 3 is a perspective view showing an outline construction of the chamber temperature control jacket 51.

The chamber temperature control jacket 51 has three temperature control attachments 83 shaped to follow the shape of outer peripheral surfaces of the chamber 11. As is the tank temperature control jacket 49, the chamber temperature control jacket 51 is substantially U-shaped in plan view, and is attached to contact side surfaces and a front surface of the chamber 11. Each temperature control attachment 83, preferably, is formed of a material with high thermal conductivity. Each temperature control attachment 83 defines a circulation path 85 therein for circulating the temperature control water. The circulation paths 81 are formed in a zigzag shape to have increased areas contributing to heat conduction, and extend from one inlet 71 to one outlet 72. A plurality of inlets 71 and a plurality of outlets 72 may be provided instead.

Figure 4:
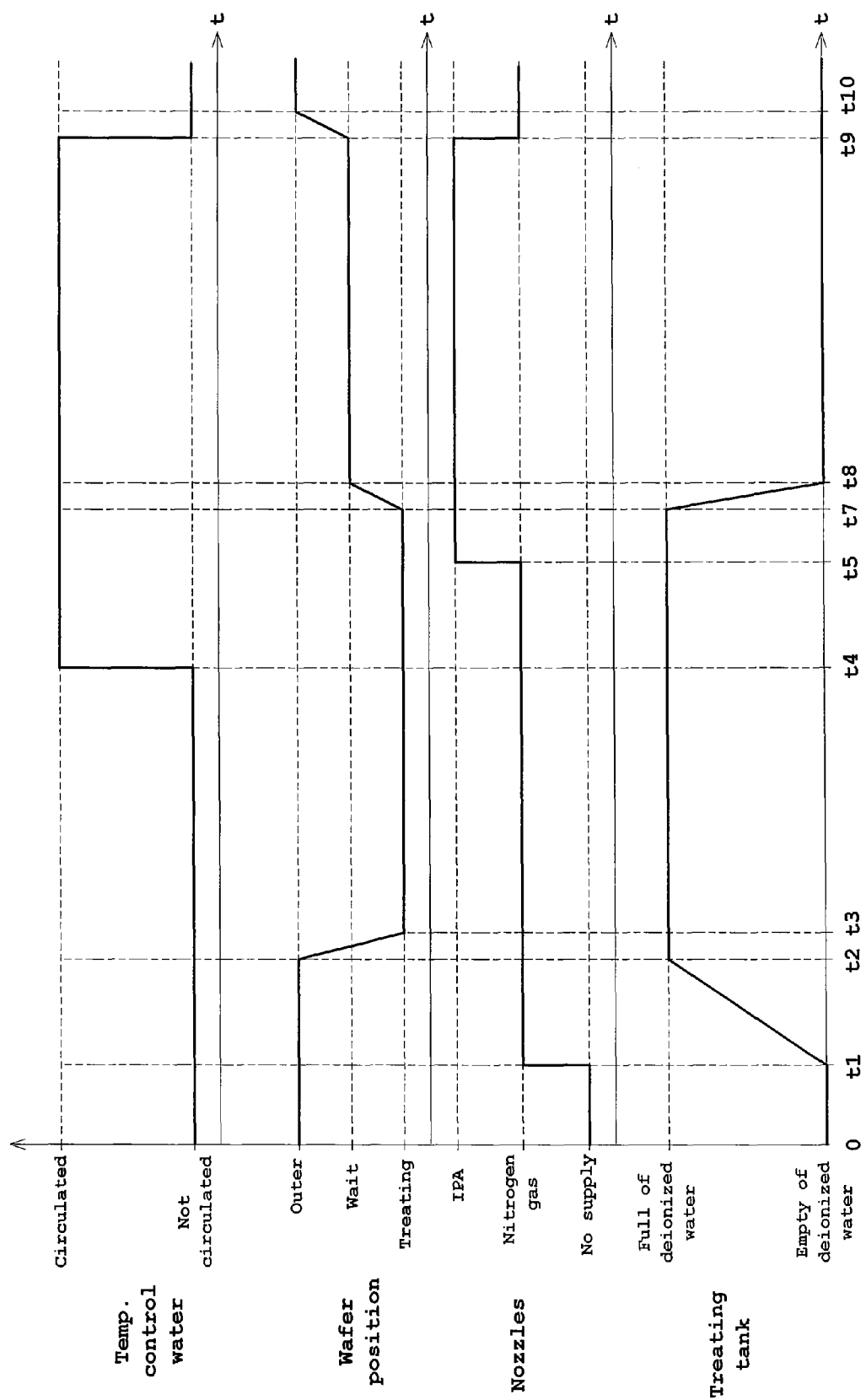
FIG. 4 is a time chart showing an example of treating process.

Next, an example of treating process by the substrate treating apparatus having the above construction will be described with reference to FIG. 4. FIG. 4 is a time chart showing the example of treating process. In this example, wafers W are cleaned with deionized water, and are pulled up for drying treatment. In the following description, it is assumed that, in an initial state, the control valve 33 and switch valves 41 and 47 are closed, and the pumps 60 and 74 are out of operation.

The controller 77 opens the switch valve 41 to purge gas from inside the chamber 11 with nitrogen gas, and opens the control valve 33 to start supplying deionized water at a predetermined flow rate into the inner tank 3 (time t3). When the deionized water overflows the inner tank 3 into the outer tank 5 and the inner tank 3 is filled with the deionized water (time t2), the shutter 15 is opened, the lift mechanism 17 holding a plurality of wafers W is lowered from the outer position OP to the process position PP (time t3), and the shutter 15 is closed. The lift mechanism 17 is maintained in the process position PP for a predetermined time until time t7.

At time t4 well in advance of time t7 when the cleaning of wafers W is finished, the pumps 60 and 74 are operated and so are the heaters 62 and 76. As a result, the temperature control water heated to a predetermined temperature is circulated through the tank temperature control jacket 49 and chamber temperature control jacket 51.

At time t5 before time t7 and after time t4, the switch valve 47 is opened. This causes nitrogen gas containing isopropyl alcohol to be supplied from the nozzles 35 to fill the chamber 11. The heating temperature noted above, preferably, is adjusted according to the concentration of the isopropyl alcohol filling the chamber 11.

After the chamber 11 is filled with the nitrogen gas containing isopropyl alcohol (time t7), the deionized water is drained from the inner tank 3 at a rapid rate through the outlet 9, and the lift mechanism 17 is raised from the process position PP to the wait position WP (time t8). The lift mechanism 17 is maintained in the wait position WP for a predetermined time to perform drying treatment (time t9). Then, the shutter 15 is opened, and the lift mechanism 17 is raised to the outer position OP (time t10). At time t9, the switch valve 47 is closed, and the pumps 60 and 74 are stopped.

As described above, at least while the inert gas containing isopropyl alcohol is supplied from the nozzles into the chamber 11 (period t5-t9), the controller 77 carries out the heating process with the tank temperature control jacket 49 and chamber temperature control jacket 51. This process can prevent the isopropyl alcohol supplied into the chamber 11 from condensing in the chamber 11 and on the treating tank 1. As a result, the concentration of the isopropyl alcohol in the chamber 11 does not decrease, thereby avoiding insufficient drying performance.

This invention is not limited to the foregoing embodiment, but may be modified as follows:

(1) In the foregoing embodiment, the tank temperature control jacket 49 and chamber temperature control jacket 51 are U-shaped in plan view, to facilitate application to existing apparatus. However, the jackets may be constructed to cover the enter peripheries and lower surface of the inner tank 3, and entire peripheries, lower surface and upper surface of the chamber 11.

(2) In the foregoing embodiment, the temperature control water is heated only by the heaters 62 and 76. However, once the treating liquid stored in the inner tank 3 is heated for treatment of wafers W, it will take a very long time to cool the liquid by relying on natural heat dissipation. The cooling of the treating liquid may be assisted by cooling the temperature control water with the cooler 61 (and cooler 75) to cool the inner tank 3 (and chamber 11) from the peripheries thereof, thereby lowering the temperature of the treating liquid quickly.

(3) A construction for circulating the temperature control water also through the back board 20 and holder 19 of the lift mechanism 17 may be employed to prevent condensation of isopropyl alcohol on these components.

(4) In the foregoing embodiment, the treating liquid supplied to the treating tank 1 is drained. This invention is applicable also to the type that circulates the treating liquid.

(5) From the viewpoint of explosion-proof capability, the temperature control using the temperature control water as in the foregoing embodiment is preferred. However, it is possible to employ a tank temperature control device and a chamber temperature control device for directly controlling temperatures of the inner tank 3 and chamber 11 with heaters and coolers.

(6) The timing of temperature control is not limited to the period t5-t9 as described above. The temperature control water may be circulated at all times.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating substrates with a treating liquid, comprising:
   a treating tank for storing the treating liquid, and treating the substrates as immersed in the treating liquid;
   a chamber surrounding said treating tank;

a supply device for supplying an inert gas containing an organic solvent into said chamber;

a lift mechanism vertically movable, while supporting the substrates, between a process position in said treating tank and a wait position above said treating tank and inside said chamber;

a tank temperature control device arranged and operable for heating said treating tank and having a tank temperature control jacket attached to outer surfaces of said treating tank;

a chamber temperature control device for controlling temperature of said chamber; and a control device configured for causing said tank temperature control device and said chamber temperature control device to perform heating treatment, with the substrates being immersed in the treating liquid stored in said treating tank, at least while the inert gas containing the organic solvent is supplied from said supply device;

wherein said tank temperature control jacket includes three temperature control attachments substantially U-shaped in plan view and thereby shaped to match shapes of a pair of opposite side surfaces and of a front surface of said treating tank, said three temperature control attachments being attached in contact with said side surfaces and said front surface of said treating tank.

2. An apparatus as defined in claim 1, wherein said chamber temperature control device includes a chamber temperature control jacket attached to outer surfaces of said chamber.

3. An apparatus as defined in claim 1, wherein said tank temperature control device and said chamber temperature control device are constructed to have heating and cooling capabilities, said control device causing said tank temperature control device to carry out a cooling performance when lowering temperature of the treating liquid stored in said treating tank.

4. An apparatus as defined in claim 2, wherein said tank temperature control device and said chamber temperature control device are constructed to have heating and cooling capabilities, said control device causing said tank temperature control device to carry out a cooling performance when lowering temperature of the treating liquid stored in said treating tank.

5. An apparatus as defined in claim 1, wherein said treating tank includes an inner tank for storing the treating liquid and an outer tank for collecting the treating liquid overflowing the inner tank, said tank temperature control jacket having three temperature control attachments substantially U-shaped in plan view to follow shapes of opposite side surfaces and a front surface of said inner tank, said three temperature control attachments being attached to contact the side surfaces and the front surface of said inner tank.

6. An apparatus as defined in claim 2, wherein said chamber temperature control jacket has three temperature control attachments substantially U-shaped in plan view to follow shapes of outer peripheral surfaces of said chamber, said three temperature control attachments being attached to contact side surfaces and a front surface of said chamber.

7. An apparatus as defined in claim 1, wherein said tank temperature control device and said chamber temperature control device use deionized water as temperature control water.

8. An apparatus as defined in claim 2, wherein said tank temperature control device and said chamber temperature control device use deionized water as temperature control water.

9. An apparatus as defined in claim 3, wherein said tank temperature control device and said chamber temperature control device use deionized water as temperature control water.

10. An apparatus as defined in claim 5, wherein said tank temperature control device and said chamber temperature control device use deionized water as temperature control water.

11. An apparatus as defined in claim 1, wherein said control device causes said tank temperature control device and said chamber temperature control device to perform the heating treatment before a point of time when treatment of the substrates with the treating liquid finishes.

12. An apparatus as defined in claim 2, wherein said control device causes said tank temperature control device and said chamber temperature control device to perform the heating treatment before a point of time when treatment of the substrates with the treating liquid finishes.

* * * * *